(12) United States Patent
Divakaruni et al.

(10) Patent No.: US 7,871,895 B2
(45) Date of Patent: Jan. 18, 2011

(54) METHOD AND STRUCTURE FOR RELIEVING TRANSISTOR PERFORMANCE DEGRADATION DUE TO SHALLOW TRENCH ISOLATION INDUCED STRESS

(75) Inventors: Ramachandra Divakaruni, Ossining, NY (US); Wai-Kin Li, Beacon, NY (US); Haining S. Yang, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 408 days.

(21) Appl. No.: 12/033,322

(22) Filed: Feb. 19, 2008

(65) Prior Publication Data

US 2009/0206442 A1 Aug. 20, 2009

(51) Int. Cl.
 *H01L 21/76* (2006.01)
 *H01L 21/336* (2006.01)
(52) U.S. Cl. .................. 438/424; 438/427; 438/297; 438/404
(58) Field of Classification Search .............. 438/424, 438/440, 427, 753, 242, 218, 219, 221, 225, 438/294, 295–297, 353, 355, 359, 362, 404, 438/405, 421–423, 425–428, 435, 438
See application file for complete search history.

(56) References Cited

U.S. PATENT DOCUMENTS

| 5,747,377 | A  | * | 5/1998  | Wu ........................... 438/444 |
| 5,911,110 | A  | * | 6/1999  | Yu ............................. 438/424 |
| 6,518,194 | B2 |   | 2/2003  | Winningham et al. |
| 6,537,920 | B1 |   | 3/2003  | Krivokapic |
| 6,565,763 | B1 |   | 5/2003  | Asakawa et al. |
| 6,613,644 | B2 | * | 9/2003  | Lachner ..................... 438/424 |
| 6,849,558 | B2 |   | 2/2005  | Schaper |
| 6,893,705 | B2 |   | 5/2005  | Thomas et al. |
| 7,090,784 | B2 |   | 8/2006  | Asakawa et al. |
| 7,097,781 | B2 |   | 8/2006  | Asakawa et al. |
| 7,279,769 | B2 |   | 10/2007 | Ishitsuka et al. |
| 2007/0200196 | A1 |   | 8/2007 | Kumar et al. |

\* cited by examiner

*Primary Examiner*—Chuong A. Luu
(74) *Attorney, Agent, or Firm*—Cantor Colburn LLP; Joseph Petrokaitis

(57) ABSTRACT

A method of forming shallow trench isolation (STI) regions for semiconductor devices, the method including defining STI trench openings within a semiconductor substrate; filling the STI trench openings with an initial trench fill material; defining a pattern of nano-scale openings over the substrate, at locations corresponding to the STI trench openings; transferring the pattern of nano-scale openings into the trench fill material so as to define a plurality of vertically oriented nano-scale openings in the trench fill material; and plugging upper portions of the nano-scale openings with additional trench fill material, thereby defining porous STI regions in the substrate.

16 Claims, 12 Drawing Sheets

METHOD AND STRUCTURE FOR RELIEVING TRANSISTOR PERFORMANCE DEGRADATION DUE TO SHALLOW TRENCH ISOLATION INDUCED STRESS

BACKGROUND

The present invention relates generally to semiconductor device processing techniques and, more particularly, to a method and structure for relieving transistor performance degradation due to shallow trench isolation (STI) induced stresses.

Integrated circuits having transistors in close proximity to each other can often exhibit unintended current leakage between adjacent transistors. As a result, various isolation techniques have been developed to reduce such leakage currents. For example, STI is one conventional approach frequently used to reduce leakage currents for integrated circuits having nominal feature sizes of about 90 nanometers (nm) or smaller. STI entails the creation of trenches within a substrate (e.g., silicon, silicon-on-insulator, etc.) located between adjacent transistors. The trenches are then filled with a dielectric material, such as silicon dioxide, for example, so as to provide a barrier that impedes the flow of leakage current between the transistors on opposite sides of the trench.

Unfortunately, the use of STI structures can create undesirable stresses on the channels of adjacent transistors, depending upon the channel type, doping level, width, and length of adjacent transistors, as well as the spacing between the channel and the trench and the spacing between additional trenches. This stress is generally most pronounced in low voltage transistors (e.g., transistors having an operating voltage in the range of approximately 1.2 volts to 3.3 volts). In such low voltage transistors, a compressive STI stress can cause reduced electron mobility and increased hole mobility, thus resulting in slightly enhanced p-type metal oxide semiconductor (PMOS) performance but significantly degraded n-type metal oxide semiconductor NMOS performance. Regardless, the net effect of such changes is slower performance of integrated circuits such as, for example, complementary metal oxide semiconductor (CMOS) circuits.

In the past, STI stress was less of an issue because of the relative large size of the gate oxide areas and device size in general. However, as device sizes continue to shrink, the spacing between the STI and the transistor channel is reduced. As a result, the performance degradation becomes more severe. For example, in 65 nm technology, NFET device performance is degraded by about 12% or more due to compressive stress. Accordingly, it would be desirable to be able to alleviate STI stress related performance degradation for integrated circuit (IC) devices having conventionally formed STI regions.

SUMMARY

The foregoing discussed drawbacks and deficiencies of the prior art are overcome or alleviated, in an exemplary embodiment, by a method of forming shallow trench isolation (STI) regions for semiconductor devices, the method including defining STI trench openings within a semiconductor substrate; filling the STI trench openings with an initial trench fill material; defining a pattern of nano-scale openings over the substrate, at locations corresponding to the STI trench openings; transferring the pattern of nano-scale openings into the trench fill material so as to define a plurality of vertically oriented nano-scale openings in the trench fill material; and plugging upper portions of the nano-scale openings with additional trench fill material, thereby defining porous STI regions in the substrate.

In another embodiment, a method of forming shallow trench isolation (STI) regions for semiconductor devices includes defining STI trench openings within a semiconductor substrate; filling the STI trench openings with an initial trench fill material; recessing a portion of the initial trench fill material; forming a first hardmask layer over the substrate and initial trench fill material; depositing a self-assembling, diblock layer over the first hardmask layer, wherein thicker portions of the diblock layer correspond to locations of the STI trench openings; annealing the diblock layer so as to define a pattern of nano-scale openings in the thicker portions thereof, at the locations corresponding to the STI trench openings; transferring the pattern of nano-scale openings into the first hardmask, and removing remaining portions of the diblock layer; transferring the pattern of nano-scale openings from the first hardmask into the trench fill material so as to define a plurality of vertically oriented nano-scale openings in the trench fill material; and plugging upper portions of the nano-scale openings with additional trench fill material, thereby defining porous STI regions in the substrate.

In still another embodiment, a semiconductor device structure includes one or more shallow trench isolation (STI) regions formed within a substrate; the one or more STI regions comprising a trench opening filled with a trench fill material; and a plurality of vertically oriented, nano-scale openings formed within the trench fill material so as to render the one or more STI regions porous.

BRIEF DESCRIPTION OF THE DRAWINGS

Referring to the exemplary drawings wherein like elements are numbered alike in the several Figures.

DETAILED DESCRIPTION

Disclosed herein is a method of a method and structure for relieving transistor performance degradation due to STI induced stresses. Briefly stated, a targeted sub-lithographic patterning technique is used to define a pattern of well-ordered, vertically oriented nano-scale voids (openings) of a generally cylindrical shape within filled STI regions. As a result, the STI regions are made more porous with respect to conventionally formed STI regions so as render the regions more flexible, thereby alleviating stresses that cause degradation of transistor (e.g., NFET) performance.

It has been known that certain materials are capable of spontaneous organization into ordered patterns without the need for human interference, which is typically referred to as the "self-assembly" of materials. Examples of self-assembling material patterns range from snowflakes to seashells to sand dunes, all of which form some type of regular or ordered pattern in response to the external conditions.

Among various self-assembling materials, self-assembling block copolymers that are capable of self-organizing into nanometer-scale patterns are particularly promising for enabling future advances in the semiconductor technology. Each self-assembling block copolymer system typically contains two or more different polymeric block components that are immiscible with one another. Under suitable conditions, the two or more immiscible polymeric block components separate into two or more different phases on a nanometer scale and thereby form ordered patterns of isolated nano-sized structural units.

The ordered patterns of isolated nano-sized structural units formed by the self-assembling block copolymers can be used for fabricating nano-scale structural units in semiconductor, optical, and magnetic devices. Specifically, dimensions of the structural units so formed are typically in the range of 10 to 40 nm, which are sub-lithographic (i.e., below the resolutions of existing lithographic tools). Further, the self-assembling block copolymers are compatible with conventional semiconductor, optical, and magnetic processes. Heretofore, exemplary applications of the ordered patterns of nano-sized structural units formed by such block copolymers in the semiconductor industry have been limited to the formation of certain semiconductor, optical, and magnetic devices where a large, ordered array of repeating structural units is required.

Figure 1B:
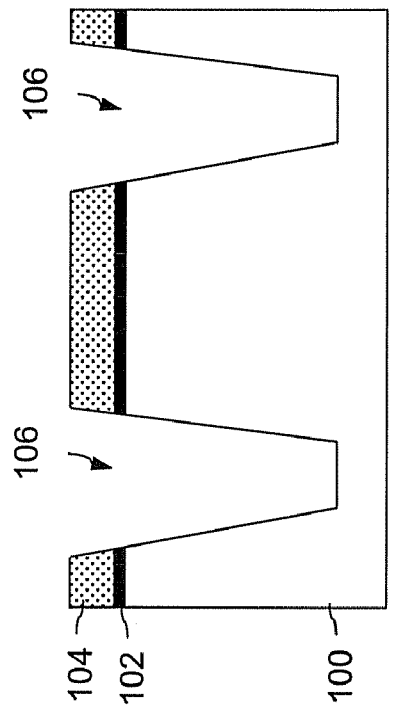
FIGS. 1 through 9 are a sequence of top down and cross sectional views illustrating a method of forming STI regions for semiconductor devices, in accordance with an embodiment of the invention.
Figure 1A:
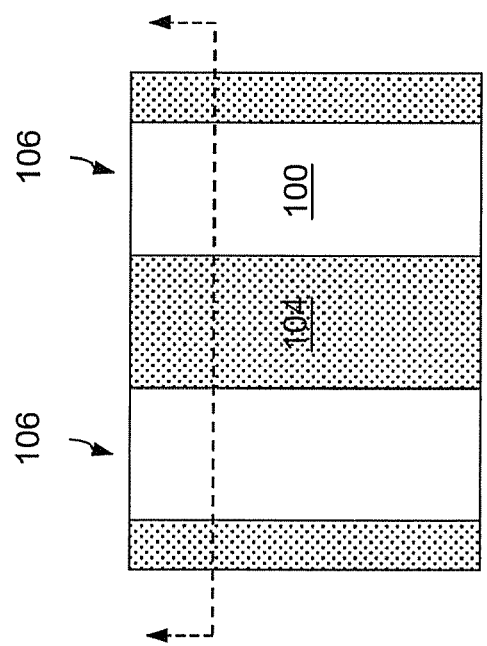

Referring generally to FIGS. 1 through 9, there is shown a sequence of top down and cross sectional views illustrating a method of forming an STI region for semiconductor devices, in accordance with an embodiment of the invention. Beginning in FIGS. 1(a) and 1(b) an initial STI formation process is illustrated. In particular, FIG. 1(a) is a top down view and FIG. 1(b) is a cross sectional view along the arrows of FIG. 1(a). As is shown, a semiconductor substrate (e.g., silicon, silicon germanium, silicon-on-insulator (SOI), etc.) has a protective layer 102 (e.g., tetraethyl orthosilicate or TEOS) and a sacrificial cap layer (e.g., nitride) 104 formed thereon. In addition, FIG. 1 shown an STI trench opening pattern 106 etched into the substrate 100 (as well as layers 102, 104).

Figure 2B:
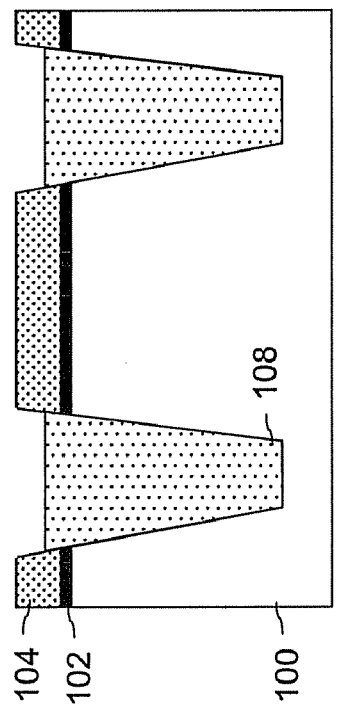
Figure 2A:
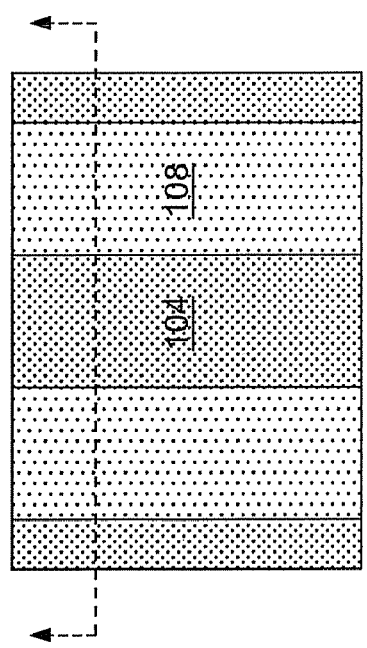
Figure 3B:
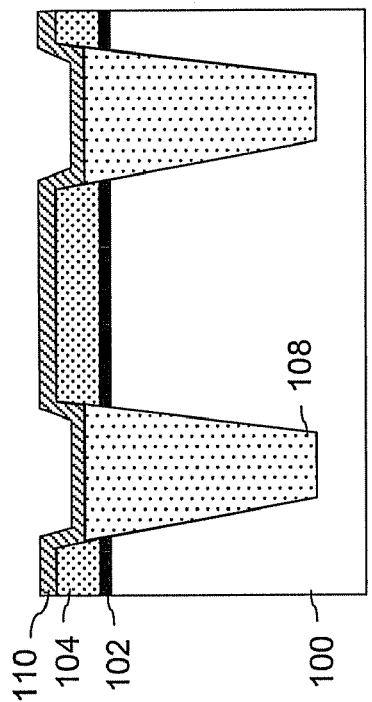
Figure 3A:
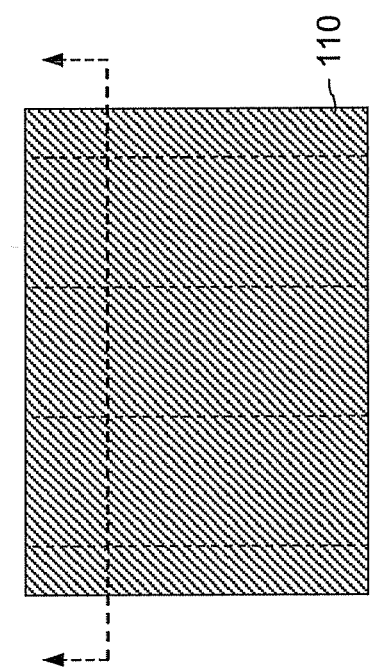

As then shown in FIGS. 2(a) and 2(b), the trench openings 106 are filled with an insulative material 108 (e.g., SiO$_2$), such as by high density plasma (HDP) deposition. The STI material 108 may then be recessed slightly, below the level of the pad nitride layer 104, as particularly shown in FIG. 2(b). Then, in FIGS. 3(a) and 3(b), a first hardmask layer 110 (e.g., silicon nitride) is formed, such as by deposition, for example, over the entire device, including the filled STI regions. To this point, the STI processing may take place in accordance with existing processes of record.

Figure 4B:
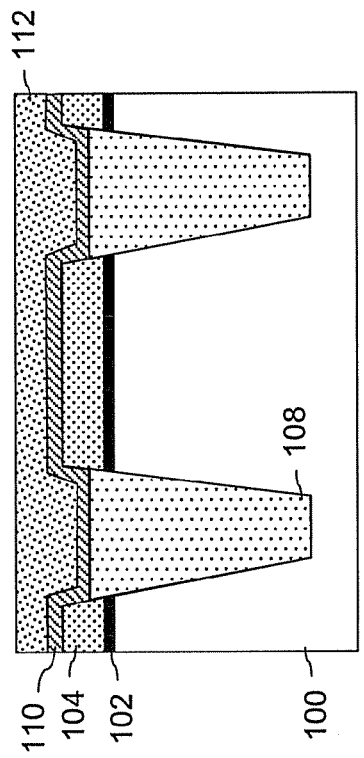
Figure 4A:
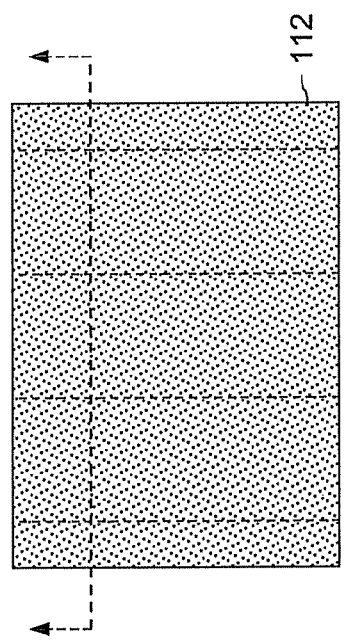
Figure 5B:
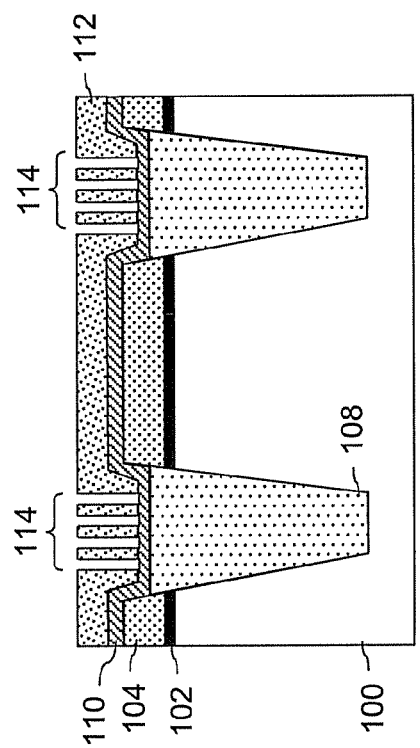
Figure 5A:
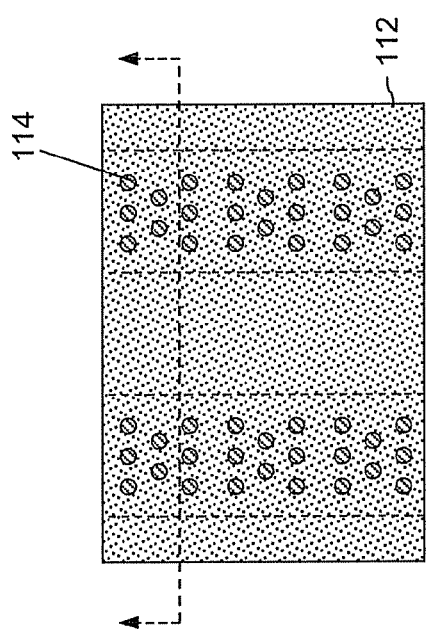

However, as then shown in FIGS. 4(a) and 4(b), a diblock coating 112 formed over the device by a spin-on coating technique. The diblock coating 112, in an exemplary embodiment, includes a copolymer mixture of polystyrene (PS) and poly(methyl-methacrylate) (PMMA). Once the diblock coating 112 is annealed, the PS block polymer is rearranged to form a regular pattern of nano-scale openings 114, as shown in FIGS. 5(a) and 5(b). Notably, the regions of the diblock material 112 that are rearranged to form the openings 114 correspond to regions of sufficient thickness to allow the cylindrical nano-scale openings. In other words, by controlling the topography of the device on which the diblock material is formed, the locations where the nano-scale openings are formed may be precisely controlled. More specifically, by controlling the device topography such that the thick regions of the diblock material 112 correspond to the STI locations, an ordered pattern of nano-scale openings may be defined over the STI regions.

Figure 6B:
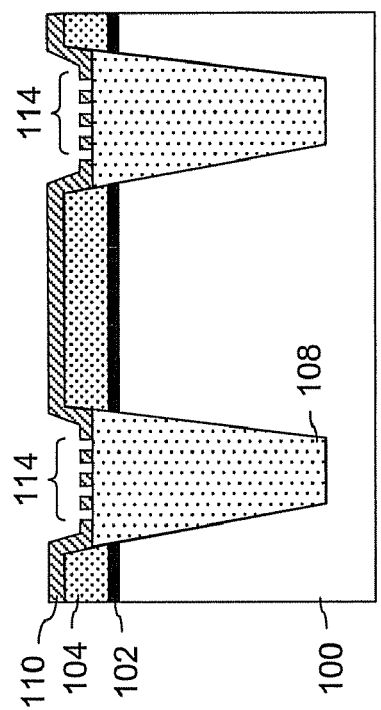
Figure 6A:
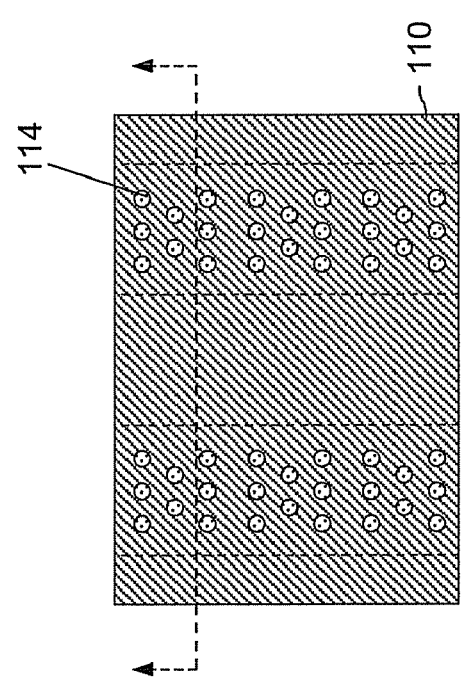

As indicated above, the nano-scale openings 114 formed by anneal of a diblock copolymer are on the order of about 10 to 40 nm in diameter, which are sub-lithographic in terms of existing photolithographic technology. Following the anneal and development of the diblock material 112, a transfer etch is used in order to transfer the pattern 114 into the first hardmask layer 110, as shown in FIGS. 6(a) and 6(b). In FIGS. 6(a) and 6(b), the diblock layer is also removed following the pattern transfer.

Figure 7B:
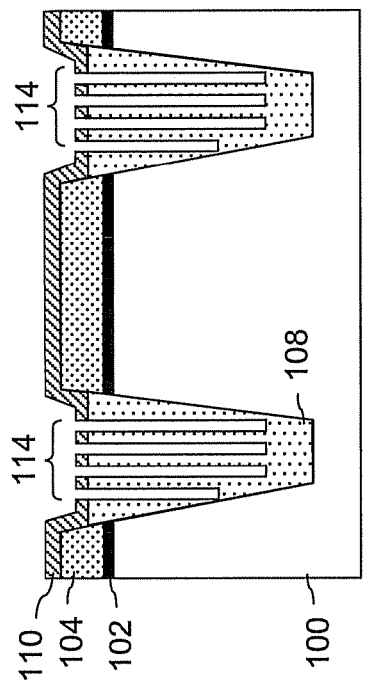
Figure 7A:
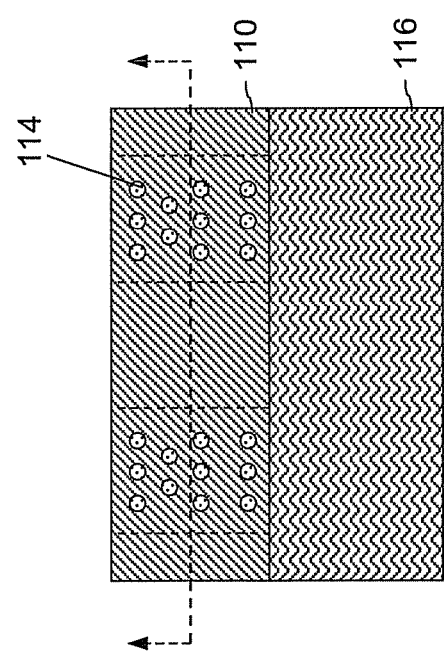

Referring next to FIGS. 7(a) and 7(b), a blocking layer 116 (e.g., a photoresist) is applied over portions of the device corresponding to selected PFET regions whose performance is desired to remain enhanced by conventional STI stresses. On the other hand, there may be other PFET regions of the device where the formation of the nano-scale openings in the adjacent STI regions are actually desired. In this case, such PFET regions would not be blocked by blocking layer 116. One possible tradeoff in this regard would be a lower capacitance (due to voids in the STI material) at a cost of slightly reduced PFET performance. Once the blocking layer 116 is applied and patterned over the desired regions, the nano-scale openings 114 are then transferred from the first hardmask layer 110 into the STI material 108, as further illustrated in FIGS. 7(a) and 7(b). Notably, at the outer edge regions of the STI material 108, the depth of the nano-scale openings 114 may be smaller than those in the center of the STI regions, due to etch selectivity of the STI material 108 with respect to the substrate material 100.

Figure 8B:
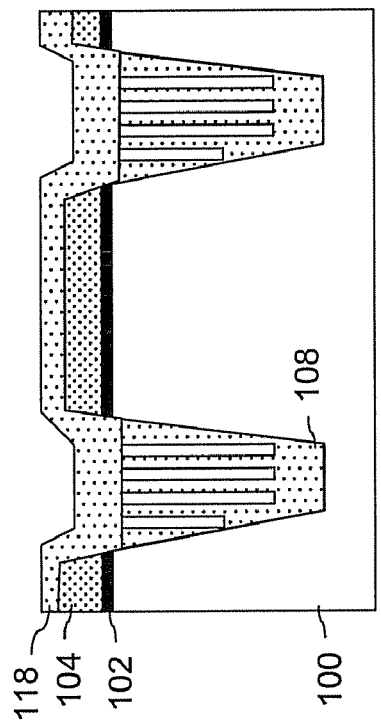
Figure 8A:
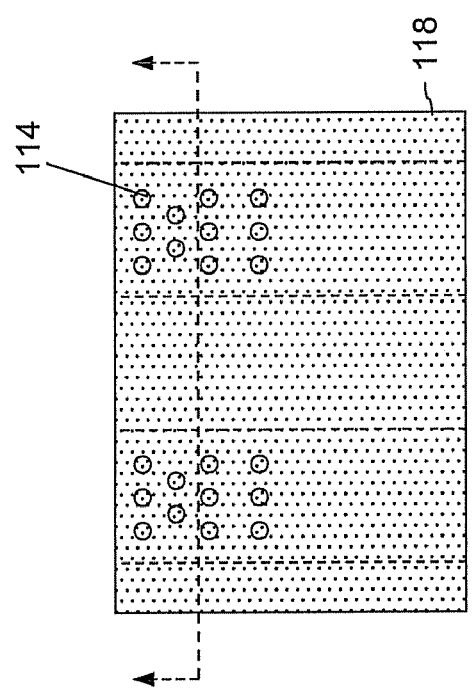
Figure 9B:
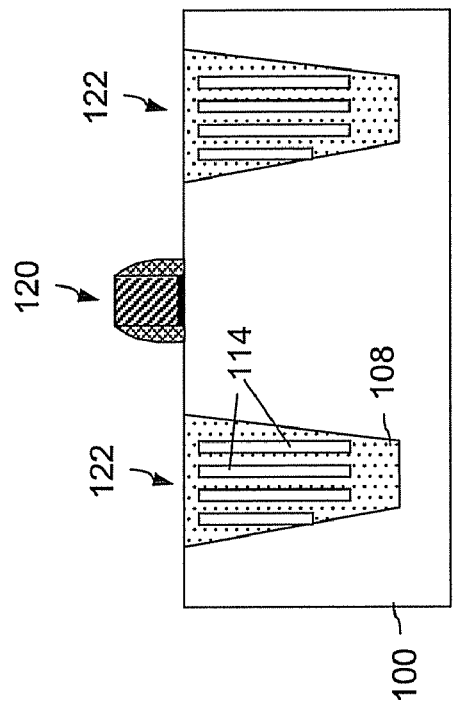
Figure 9A:
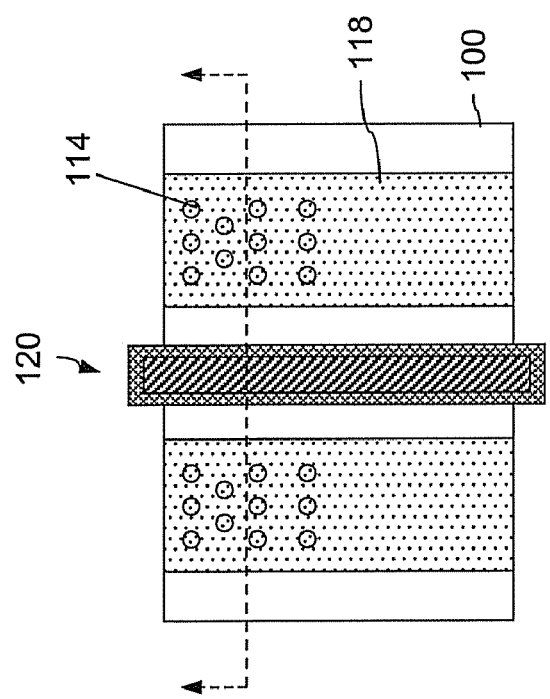
Figure 10:
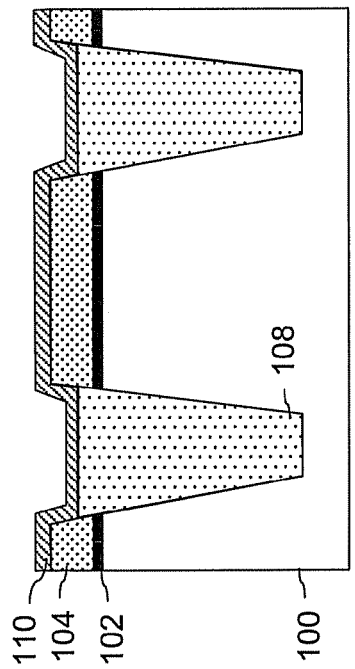
FIGS. 10 through 14 are a sequence of cross sectional views illustrating an alternative processing embodiment of FIGS. 3(*b*) through 7(*b*).

After completion of the STI material etch, remaining portions of the blocking layer 116 and first hardmask layer 110 are removed. As shown in FIGS. 8(a) and 8(b), another HDP oxide layer 118 is formed to plug the upper portions of the nano-scale openings 114. It should be appreciated that layer 118 should be formed in a manner so as not to re-fill the entire vertical column defined by the nano-scale openings 114. Finally, as shown in FIGS. 9(a) and 9(b), excess portions of the oxide layer 118 are removed (e.g., by chemical mechanical polishing (CMP)), as well as the pad nitride layer 104 and protective layer TEOS layer 102 so as to expose the substrate 100 for active device formation. For example, FIGS. 9(a) and 9(b) further illustrates a gate structure 120 as will be recognized in the art. Thereafter, conventional front-end-of-line processing can continue. Thus formed, the completed STI regions 122, having vertically oriented nano-scale openings 114 of a generally cylindrical shape therein, allow for improved NFET performance as the stress caused thereby is reduced to the porosity of the fill material 108.

As also mentioned above, the effectiveness in determining the regions of nano-scale openings is dependent upon by effectively controlling the topography of the device on which the diblock material is formed. Ideally, the topography of FIG. 3(b) (with respect to the STI regions) is present prior to spin coating the diblock material 112 in FIG. 4(b), so as to have the thicker portions of the diblock correspond to the STI regions. However, it is conceivable that certain processing techniques (e.g., CMP) may not result in such an ideal topography for diblock formation. Accordingly, FIGS. 10 through 14 are a sequence of cross sectional views illustrating an alternative processing embodiment of FIGS. 3(b) through 7(b), wherein FIG. 10 corresponds to the same point of the process as in FIG. 3(b); i.e., deposition of the first hardmask layer 110.

Figure 11:
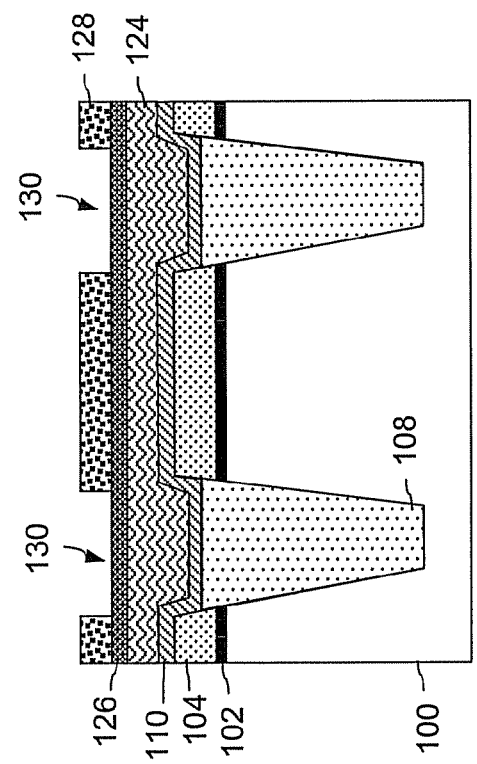

In lieu of proceeding directly to diblock formation, a planarizing layer 124 (e.g., of an organic material) is instead formed over the entire device, as shown in FIG. 11, thereby resulting in a substantially flat device topography at this point. As further shown in FIG. 11, a second hardmask layer 126 (e.g., a nitride or photoresist layer) is formed over the planarizing layer 124, followed by a third hardmask layer 128 atop the second hardmask layer 126. The third hardmask 128 layer may be, for example, a low-temperature (e.g., 300° C.) chemical vapor deposited (CVD) oxide material. The third hardmask layer 128 is patterned to have openings 130 corresponding to the locations of the STI regions. Thus formed, the second (planar) hardmask layer 126 and third (patterned) hardmask layer 128 together create the desired topography for a subsequent diblock formation used to create the nano-scale opening pattern that is ultimately transferred into the STI material 108.

Figure 12:
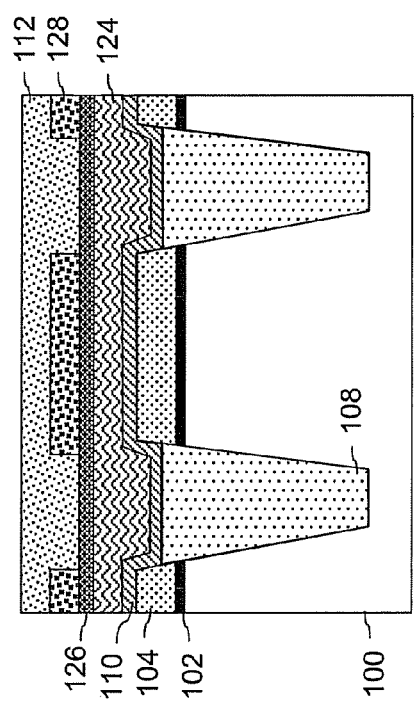
Figure 13:
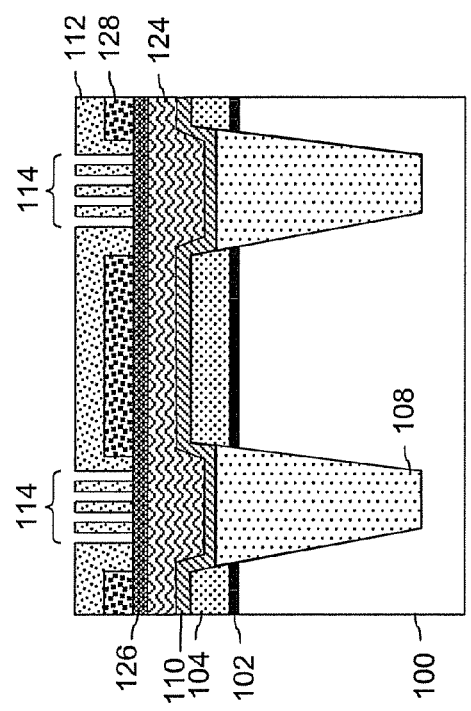
Figure 14:
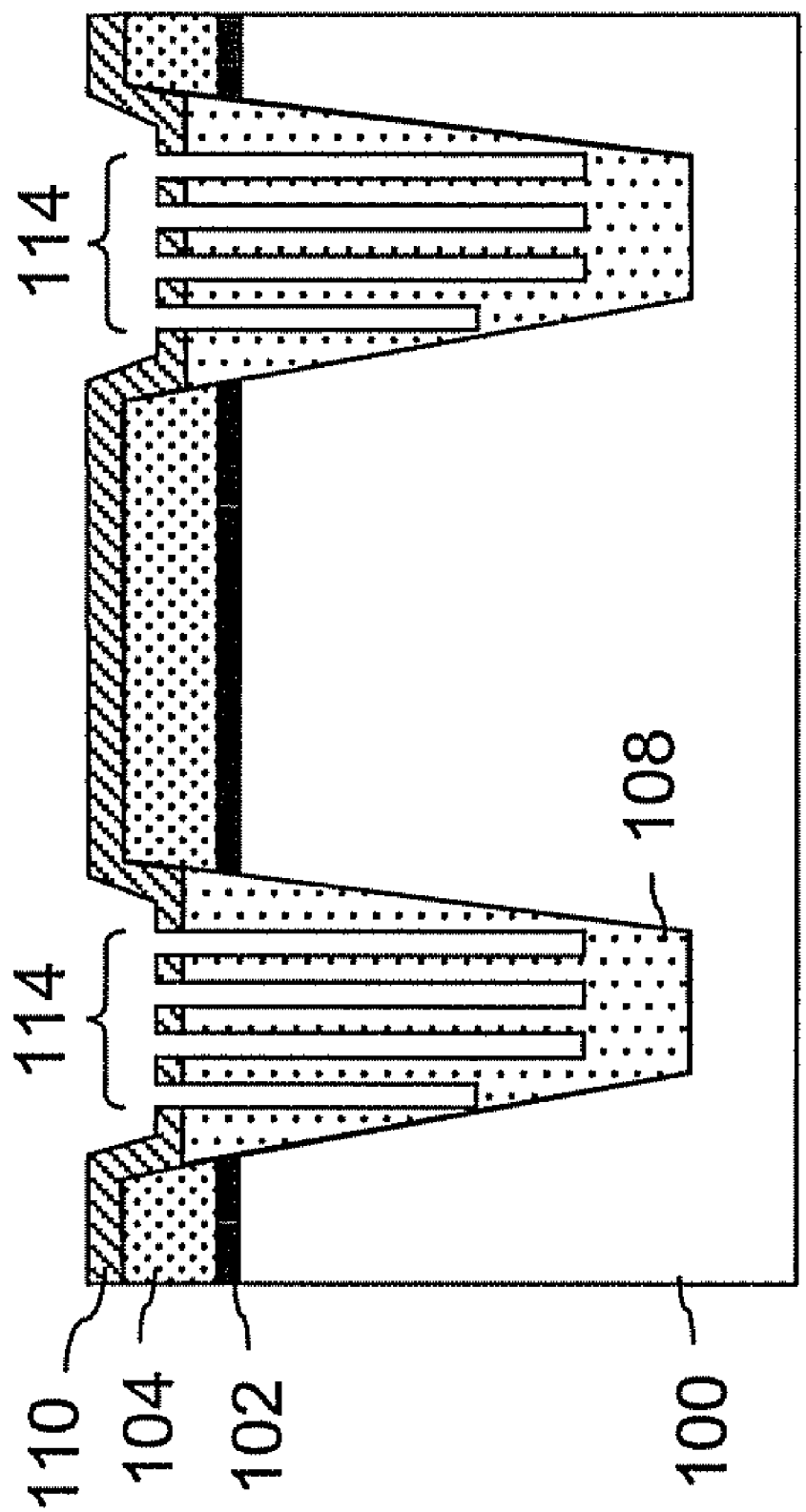

The diblock layer 112 formation is shown in FIG. 12, and the resulting nano-scale pattern 114 within the diblock layer 112 following the anneal and developing steps is shown in FIG. 13. The pattern of openings 114 may then be sequentially etched through the second hardmask layer 126, the planarizing layer 124 and then the first hardmask layer 110. After removal of the remaining portions of the diblock layer 112, the third hardmask layer 128, the second hardmask layer 126 and the planarizing layer 124, as shown in FIG. 14, the earlier described process operations of FIGS. 8 and 9 may be implemented.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method of forming shallow trench isolation (STI) regions for semiconductor devices, the method comprising:
    defining STI trench openings within a semiconductor substrate;
    filling the STI trench openings with an initial trench fill material;
    defining a pattern of nano-scale openings over the substrate, at locations corresponding to the STI trench openings;
    transferring the pattern of nano-scale openings into the trench fill material so as to define a plurality of vertically oriented nano-scale openings in the trench fill material; and
    plugging upper portions of the nano-scale openings with additional trench fill material, thereby defining porous STI regions in the substrate.

2. The method of claim 1, wherein the pattern of nano-scale openings are defined by annealing a self-assembling, diblock layer formed over the initial trench fill material.

3. The method of claim 2, wherein the diblock layer comprises a copolymer mixture of polystyrene (PS) and poly (methyl-methacrylate) (PMMA).

4. The method of claim 1, wherein the nano-scale opening are on the order of about 10 nanometers (nm) to about 40 nm in diameter.

5. The method of claim 2, further comprising defining a surface topography prior to the formation of the diblock layer such that thicker regions of the formed diblock layer correspond to the location of the STI trench openings.

6. The method of claim 1, further comprising forming a blocking layer over the substrate prior to transferring the pattern of nano-scale openings into the trench fill material so as form the porous STI regions in first regions of the substrate and form non-porous STI regions in second regions of the substrate.

7. The method of claim 6, wherein the first regions of the substrate correspond to STI regions between which are formed NFET devices, and the first regions of the substrate correspond to STI regions between which are formed PFET devices.

8. A method of forming shallow trench isolation (STI) regions for semiconductor devices, the method comprising:
    defining STI trench openings within a semiconductor substrate;
    filling the STI trench openings with an initial trench fill material;
    recessing a portion of the initial trench fill material;
    forming a first hardmask layer over the substrate and initial trench fill material;
    depositing a self-assembling, diblock layer over the first hardmask layer, wherein thicker portions of the diblock layer correspond to locations of the STI trench openings;
    annealing the diblock layer so as to define a pattern of nano-scale openings in the thicker portions thereof, at the locations corresponding to the STI trench openings;
    transferring the pattern of nano-scale openings into the first hardmask, and removing remaining portions of the diblock layer;
    transferring the pattern of nano-scale openings from the first hardmask into the trench fill material so as to define a plurality of vertically oriented nano-scale openings in the trench fill material; and
    plugging upper portions of the nano-scale openings with additional trench fill material, thereby defining porous STI regions in the substrate.

9. The method of claim 8, wherein the diblock layer comprises a copolymer mixture of polystyrene (PS) and poly (methyl-methacrylate) (PMMA).

10. The method of claim 8, wherein the nano-scale openings are on the order of about 10 nanometers (nm) to about 40 nm in diameter.

11. The method of claim 10, wherein the nano-scale openings are of a generally cylindrical shape.

12. The method of claim 8, further comprising forming a blocking layer over the substrate prior to transferring the pattern of nano-scale openings into the trench fill material so as form the porous STI regions in first regions of the substrate and form non-porous STI regions in second regions of the substrate.

13. The method of claim 12, wherein the first regions of the substrate correspond to STI regions between which are formed NFET devices, and the first regions of the substrate correspond to STI regions between which are formed PFET devices.

14. The method of claim 8, further comprising:
    forming a planarizing layer on the first hardmask layer;
    forming a second hardmask layer on the planarizing layer;
    forming a third hardmask on the second hardmask layer;
    patterning the third hardmask layer to form openings therein corresponding to the locations of the STI trench openings; and
    forming the diblock layer on the third hardmask layer and exposed portions of the second hardmask layer.

15. The method of claim 14, further comprising transferring the pattern of nano-scale openings defined in the annealed diblock layer into the second hardmask layer and the planarizing layer, and thereafter transferring the pattern of nano-scale openings into the first hardmask layer.

16. The method of claim 14, wherein:
    the first hardmask layer comprises a nitride layer;
    the planarizing layer comprises an organic, spin-on layer;
    the second hardmask layer comprises one of a photoresist layer and a nitride layer; and
    the third hardmask layer comprises an oxide material deposited by chemical vapor deposition at a temperature of about 300° C.

* * * * *